(12) United States Patent
Yamaguchi et al.

(10) Patent No.: US 9,466,540 B2
(45) Date of Patent: Oct. 11, 2016

(54) DETECTING APPARATUS, WAFER AND ELECTRONIC DEVICE

(71) Applicants: ADVANTEST CORPORATION, Tokyo (JP); The University of Tokyo, Tokyo (JP)

(72) Inventors: Takahiro Yamaguchi, Saitama (JP); Satoshi Komatsu, Tokyo (JP); Kunihiro Asada, Tokyo (JP); James Sumit Tandon, Tokyo (JP)

(73) Assignees: ADVANTEST CORPORATION, Tokyo (JP); THE UNIVERSITY OF TOKYO, Tokyo (JP)

( * ) Notice: Subject to any disclaimer, the term of this patent is extended or adjusted under 35 U.S.C. 154(b) by 702 days.

(21) Appl. No.: 13/752,410

(22) Filed: Jan. 29, 2013

(65) Prior Publication Data
US 2014/0197846 A1 Jul. 17, 2014

(30) Foreign Application Priority Data
Jan. 11, 2013 (JP) ................................. 2013-003604

(51) Int. Cl.
*G01R 35/00* (2006.01)
*H01L 21/66* (2006.01)
*G01R 31/28* (2006.01)

(52) U.S. Cl.
CPC .......... *H01L 22/34* (2013.01); *G01R 31/2894* (2013.01); *H01L 2924/0002* (2013.01)

(58) Field of Classification Search
CPC .......... G01R 31/2832; G01R 31/2894; H01L 22/34; H01L 2924/00; H01L 2924/0002
USPC .................. 324/257, 438, 606–608
See application file for complete search history.

(56) References Cited

U.S. PATENT DOCUMENTS

| 5,959,481 A * | 9/1999 | Donnelly et al. ............. 327/170 |
| 2008/0034337 A1 * | 2/2008 | Kuemerle ........... G06F 17/5045 716/134 |
| 2008/0141190 A1 * | 6/2008 | Jung ................... G06F 17/5036 716/56 |
| 2009/0018787 A1 * | 1/2009 | Chuang .............. G01R 31/3004 702/71 |

OTHER PUBLICATIONS

Gosh et al. Non-Patent Literature "Slew Rate Monitoring Circuit for On-Chip Process Variation Detection" IEEE Trans. 21st International conference on VLSI Design, vol. 21, No. 9, Date Nov. 16, 2012, pp. 1683-1692.*

(Continued)

*Primary Examiner* — Benjamin M Baldridge
*Assistant Examiner* — Courtney McDonnough

(57) ABSTRACT

Provided is a detection apparatus that detects process variation in a plurality of comparators that each output a comparison result obtained by comparing a signal level of an input signal to a reference level, the detection apparatus comprising a signal input section that inputs the input signal and the reference level in common to the comparators, and sequentially changes the signal level of the input signal; and a detecting section that detects, for each signal level, a number of comparison results that indicate a predetermined result, from among the comparison results of the comparators, and detects the process variation based on a distribution of the number of comparison results that indicate the predetermined result.

14 Claims, 8 Drawing Sheets

(56) References Cited

OTHER PUBLICATIONS

Mahfuzul et al., "On-Chip Detection of Process Shift and Process Spread for Silicon Debugging and Model-Hardware Correlation"; 2012 IEEE 21st Asian Symposium; pp. 350-354.

Mukhopadhyay et al, "Statistical Characterization and On-Chip Measurement Methods for Local Random Variability of a Process Using Sense-Amplifier-Based Test Structure"; ISSCC 2007, Session 22, Digital Circuit Innovations 22.2; pp. 400-401, 601.

Kobenge et al., "A 250 KS/s, 0.8V ultra low power successive approximation register ADC using a Dynamic rail-to-rail comparator"; IEICE Electronics Express, vol. 7, No. 4, pp. 261-267.

\* cited by examiner

DETECTING APPARATUS, WAFER AND ELECTRONIC DEVICE

BACKGROUND

1. Technical Field

The present invention relates to a detection apparatus, a wafer, and an electronic device.

2. Related Art

As a conventional method of detecting process variation in MOSFETs, a method using a ring oscillator (see Non-Patent Document 1) and a method using a sense amplifier (see Non-Patent Document 2) are known.

Non-Patent Document 1: I. A. K. M. Mahfuzil, H. Onodera, "On-chip detection of process shift & process spread for silicon debugging and model-hardware correlation," ATS2012.

Non-Patent Document 2: S. Mukhopadhyay, K. Kim, K. A. Jenkins, C-T. Chuand, K. Roy, "Statistical Characterization and On-Chip Measurement Methods for Local Random Variability of a Process Using Sense-Amplifier-Based Test Structure," ISSCC 2007, February 2007.

The method of Document 1 includes measuring threshold voltages of an nMOSFET and a pMOSFET forming a ring oscillator, based on variation in the oscillation frequency of the ring oscillator. However, since an AC signal is being measured, the measurement is easily affected by jitter and there is a non-linear relationship between the threshold voltage and the oscillation frequency, and therefore it is difficult to improve the measurement accuracy. Furthermore, in the method of Document 2, information is exchanged through the scan chain, and therefore the measurement speed is low.

SUMMARY

Therefore, it is an object of an aspect of the innovations herein to provide a detection apparatus, a wafer, and a electronic device, which are capable of overcoming the above drawbacks accompanying the related art. The above and other objects can be achieved by combinations described in the claims. According to a first aspect of the present invention, provided is a detection apparatus that detects process variation in a plurality of comparators that each output a comparison result obtained by comparing a signal level of an input signal to a reference level, the detection apparatus comprising a signal input section that inputs the input signal and the reference level in common to the comparators, and sequentially changes the signal level of the input signal; and a detecting section that detects, for each signal level, a number of comparison results that indicate a predetermined result, from among the comparison results of the comparators, and detects the process variation based on a distribution of the number of comparison results that indicate the predetermined result.

According to a second aspect of the present invention, provided is a wafer comprising a plurality of comparators that each output a comparison result obtained by comparing a signal level of a common input signal to a common reference level; and a combining output section that combines the comparison results output by the comparators in response to the input signal, and outputs the resulting combination.

According to a third aspect of the present invention, provided is an electronic device comprising a plurality of comparators that each output a comparison result obtained by comparing a signal level of a common input signal to a common reference level; and a combining output section that combines the comparison results output by the comparators in response to the input signal, and outputs the resulting combination.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
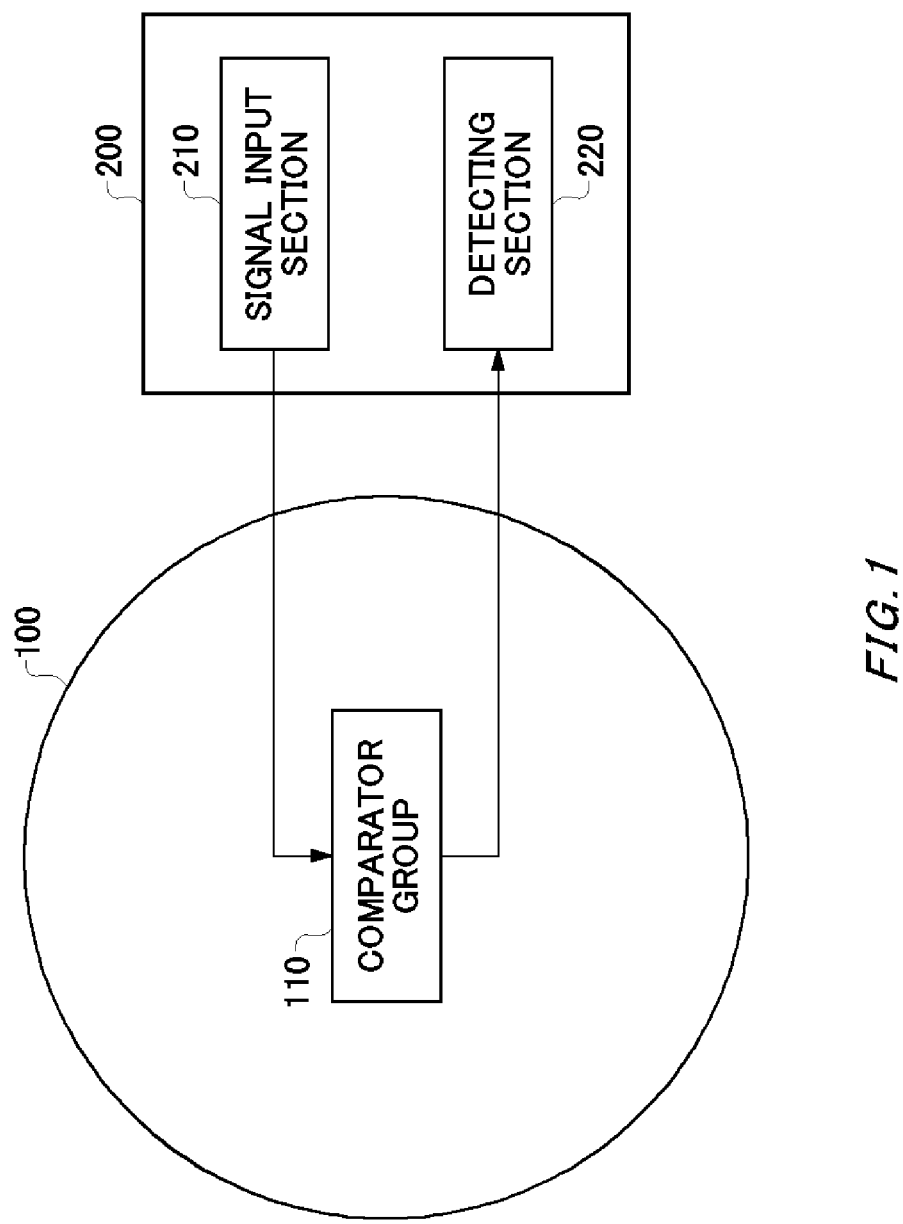
FIG. 1 shows an exemplary configuration of a detection apparatus 200 that detects process variation in a plurality of comparators.

FIG. 1 shows an exemplary configuration of a detection apparatus 200 that detects process variation in a plurality of comparators. The detection apparatus 200 of the present embodiment detects process variation of the comparators included in a comparator group 110 formed on a semiconductor wafer 100. The detection apparatus 200 includes a signal input section 210 and a detecting section 220. The target of the process variation detection performed by the detection apparatus 200 is not limited to the semiconductor wafer 100. For example, the process variation can be detected in the same manner for a electronic device or the like including a comparator group 110.

The signal input section 210 inputs an input signal and a reference level to the comparators included in the comparator group 110. The input signal in the present embodiment is a DC signal. The signal input section 210 may generate the input signal and the reference level and provide the input signal and reference level to the comparator group 110, or the signal input section 210 may control a circuit formed on the semiconductor wafer 100 to cause the circuit to generate the input signal and reference level. The detecting section 220 detects the process variation of the comparators, based on the comparison results output by the comparators in the comparator group 110. The process variation is variation in the threshold voltage of the MOSFETs included in the comparators, for example.

Figure 2:
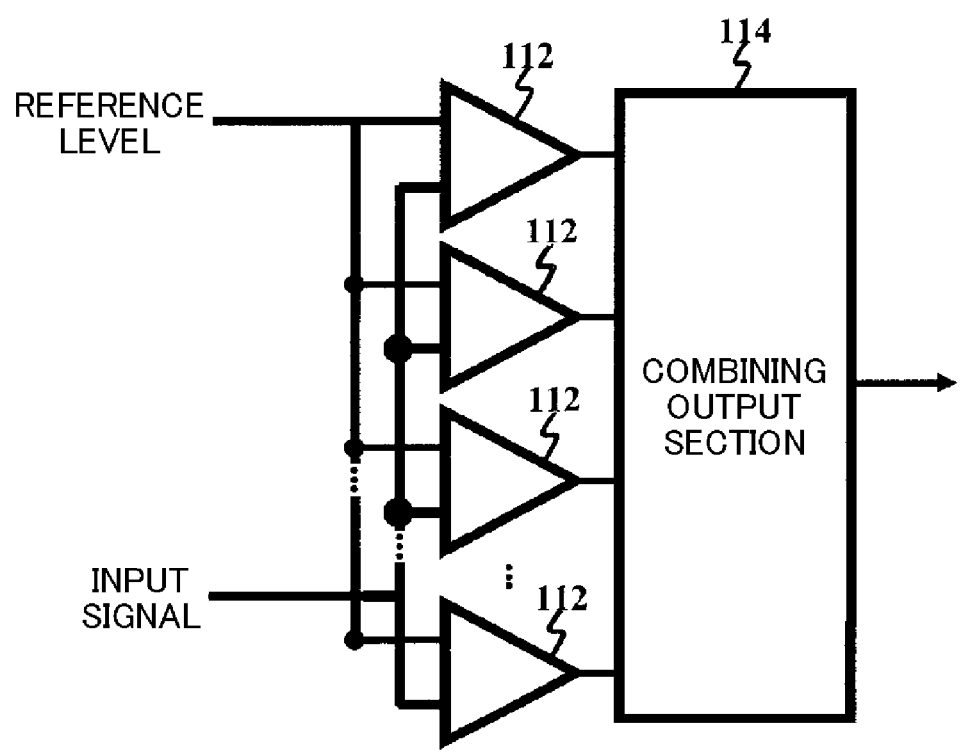
FIG. 2 shows an exemplary configuration of the comparator group 110.

FIG. 2 shows an exemplary configuration of the comparator group 110. The comparator group 110 includes a plurality of comparators 112. Each comparator 112 receives a common input signal and a common reference level, and outputs a comparison result obtained by comparing the signal level of the input signal to the reference level. The comparison result is a logic value that is 1 when the signal level of the input signal is greater than or equal to the reference level and 0 when the signal level of the input signal is less than the reference level.

The combining output section 114 outputs a combination of the comparison results output by the comparators 112 in response to the input signal. For example, the combining output section 114 may output the number of comparison results that indicate a prescribed logic value or the ratio of comparison results that indicate a prescribed logic value, from among the comparison results output by the comparators 112. As another example, the comparator group 110 may output the comparison results of the comparators 112 without alteration, in which case the combining output section 114 is not included. In this case, the detecting section 220 shown in FIG. 1 combines the comparison results.

The signal input section 210 shown in FIG. 1 sequentially changes the signal level of the input signal that is input to the comparators 112. The combining output section 114 combines the comparison results output by the comparators 112 for each signal level of the input signal. Instead of changing the input signal, the reference level may be sequentially changed. In other words, the signal input section 210 sequentially changes the difference between two target signals to be input to the comparators 112.

The detecting section 220 detects, for each signal level of the input signal, the number of comparison results indicating the predetermined result from among the comparison results of the comparators 112. As described above, notification of this number may be provided from the combining output section 114. The detecting section 220 detects the process variation of the comparators 112 based on the distribution of the number of comparison results indicating the predetermined result.

The comparators 112 may be formed within each chip die formed in the semiconductor wafer 100, or may be formed outside the chip dies. As another example, a portion of the comparators 112 may be formed in the chip dies, and another portion of the comparators 112 may be formed outside the chip dies. The detection apparatus 200 may detect process variation of the comparators 112 arranged uniformly across the entire semiconductor wafer 100.

A plurality of the comparator groups 110 may be formed on the semiconductor wafer 100. A comparator group 110 may be provided in each of a plurality of regions formed by partitioning the semiconductor wafer 100. The detection apparatus 200 may detect the process variation of the comparators 112 in each comparator group 110. The detection apparatus 200 may select comparators 112 to perform process variation detection on from among the comparators 112 in the comparator groups 110. In other words, the detection apparatus 200 controls the number of comparators 112 that undergo the process variation detection.

The detection resolution can be changed by changing the number of comparators 112 that undergo the process variation detection. Specifically, when the number of comparators 112 that undergo the process variation detection is increased, the process variation detection resolution, i.e. the measurement accuracy, in the regions where these comparator groups 110 are provided is improved. On the other hand, when the number of comparators 112 is decreased, the spatial resolution of the process variation detection can be improved.

The detection apparatus 200 may use the signal input section 210 to select the comparators 112 to undergo the process variation detection. The signal input section 210 inputs the input signal into the selected comparators 112. As another example, the detection apparatus 200 may use the detecting section 220 to select the comparators 112 to undergo the process variation detection. The detecting section 220 calculates the process variation by using the output of the selected comparators 112.

Figure 3:
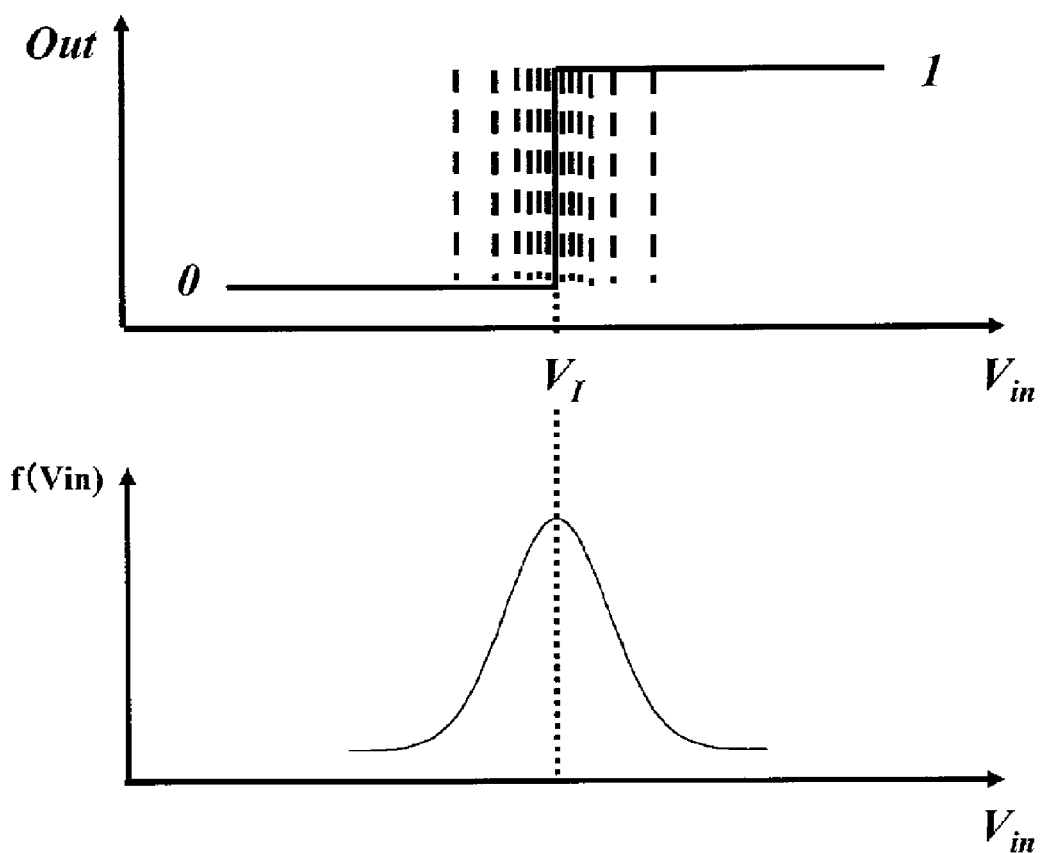
FIG. 3 is used to describe process variation in the comparators 112.

FIG. 3 is used to describe process variation in the comparators 112. In the upper portion of FIG. 3, the horizontal axis represents the signal level of the input signal and the vertical axis represents the logic values output by the comparators 112. In a case where the comparators 112 are ideal, the signal level of the input signal gradually increases and the logic values of all of the comparators 112 transition from 0 to 1 when the signal level of the input signal crosses the voltage $V_I$ corresponding to the reference level. However, due to variation in the characteristics of the comparators 112, for example, there is variation (offset) in the signal levels of the input signal at which the logic values transition.

In the lower portion of FIG. 3, the horizontal axis represents the signal level of the input signal and the vertical axis represents the probability density function $f(V_{in})$ that the logic value output by a comparator 112 will transition. Here, $f(V_{in})$ indicates the ratio of comparators 112 whose logic values transition when the signal level of the input signal is $V_{in}$, from among the plurality of comparators 112. Usually, the distribution of the probability density function $f(V_{in})$ is Gaussian, as shown in FIG. 3.

This distribution corresponds to the variation of the threshold voltage of the MOSFETs in the comparators 112. The detecting section 220 may detect the distribution. Furthermore, the detecting section 220 may detect the standard deviation $\sigma$ of the distribution.

Figure 4:
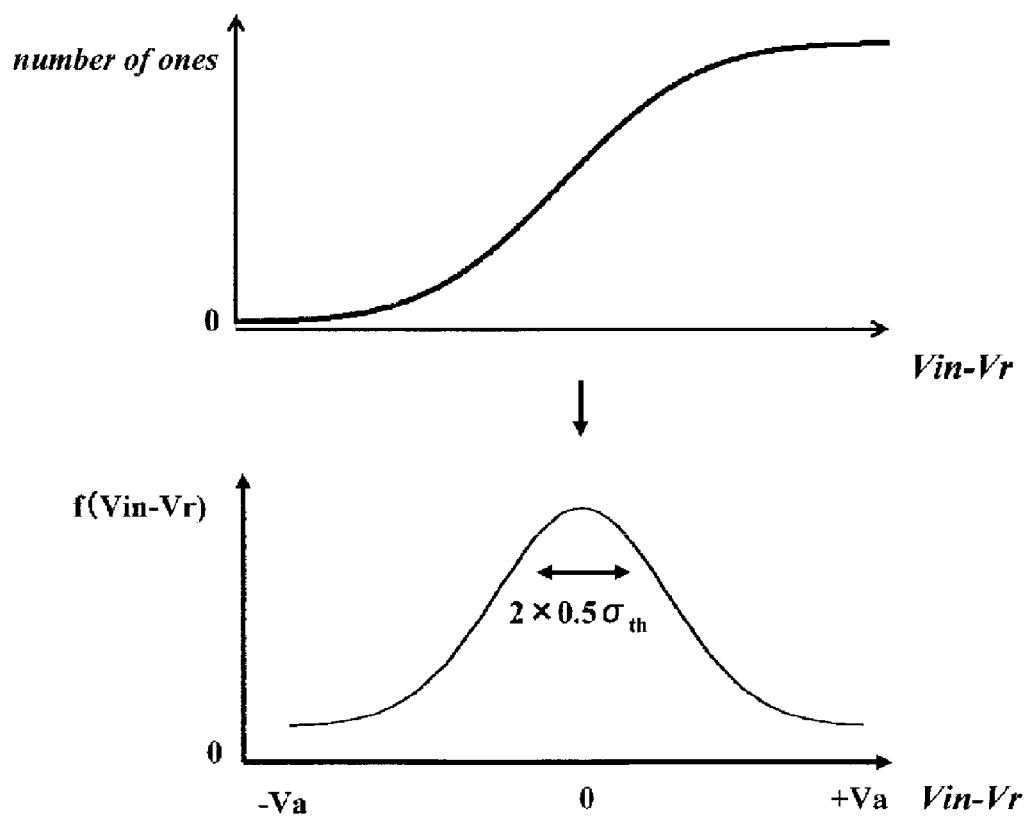
FIG. 4 shows an exemplary operation of the detecting section 220.

FIG. 4 shows an exemplary operation of the detecting section 220. In FIG. 4, the horizontal axis represents the difference between the signal level Vin of the input signal and the reference level $V_r$. Furthermore, the vertical axis in the upper portion of FIG. 4 represents the number of logic values of 1 output by the comparators 112, and the vertical axis in the lower portion of FIG. 4 represents the probability density function that the logic value output by a comparator 112 transitions, plotted against the signal level difference.

When the signal level $V_{in}$ of the input signal is sufficiently lower than the reference level $V_r$, the number of logic values of 1 output from the comparators 112 is 0, and when the signal level $V_{in}$ of the input signal is sufficiently higher than the reference level $V_r$, the number of logic values of 1 output from the comparators 112 is N, which is the same as the total number of comparators 112. When the signal level $V_{in}$ is sequentially changed, the number of comparators 112 that output a logic value of 1 changes according to the process variation of the comparators 112.

The signal input section 210 sequentially changes the signal level $V_{in}$ of the input signal, from a voltage that is sufficiently lower than the reference level $V_r$ to a voltage that is sufficiently higher than the reference level $V_r$. In this example, the voltage that is sufficiently small and the voltage that is sufficiently large refer to voltages that respectively cause the number of comparators 112 outputting a logic value of 1 to be 0 and N. Each time the difference between the signal level $V_{in}$ of the input signal and the reference level $V_r$ is changed, the detecting section 220 detects the number of comparators 112 that output a logic value of 1. In this way, the cumulative distribution function shown in the upper portion of FIG. 4 can be obtained.

The detecting section 220 calculates the standard deviation $\sigma_{th}$ of the probability density function by converting the acquired cumulative density function into the probability density function shown in the lower portion of FIG. 4. The standard deviation $\sigma_{th}$ corresponds to the variation in the threshold voltage of the transistors in the comparators 112.

In this way, by inputting a common input signal and reference level to the comparators 112 and changing the signal level of the input signal, the process variation of the comparators 112 can be detected quickly. Furthermore, the process variation can be accurately detected without being affected by jitter or the like.

Figure 5:
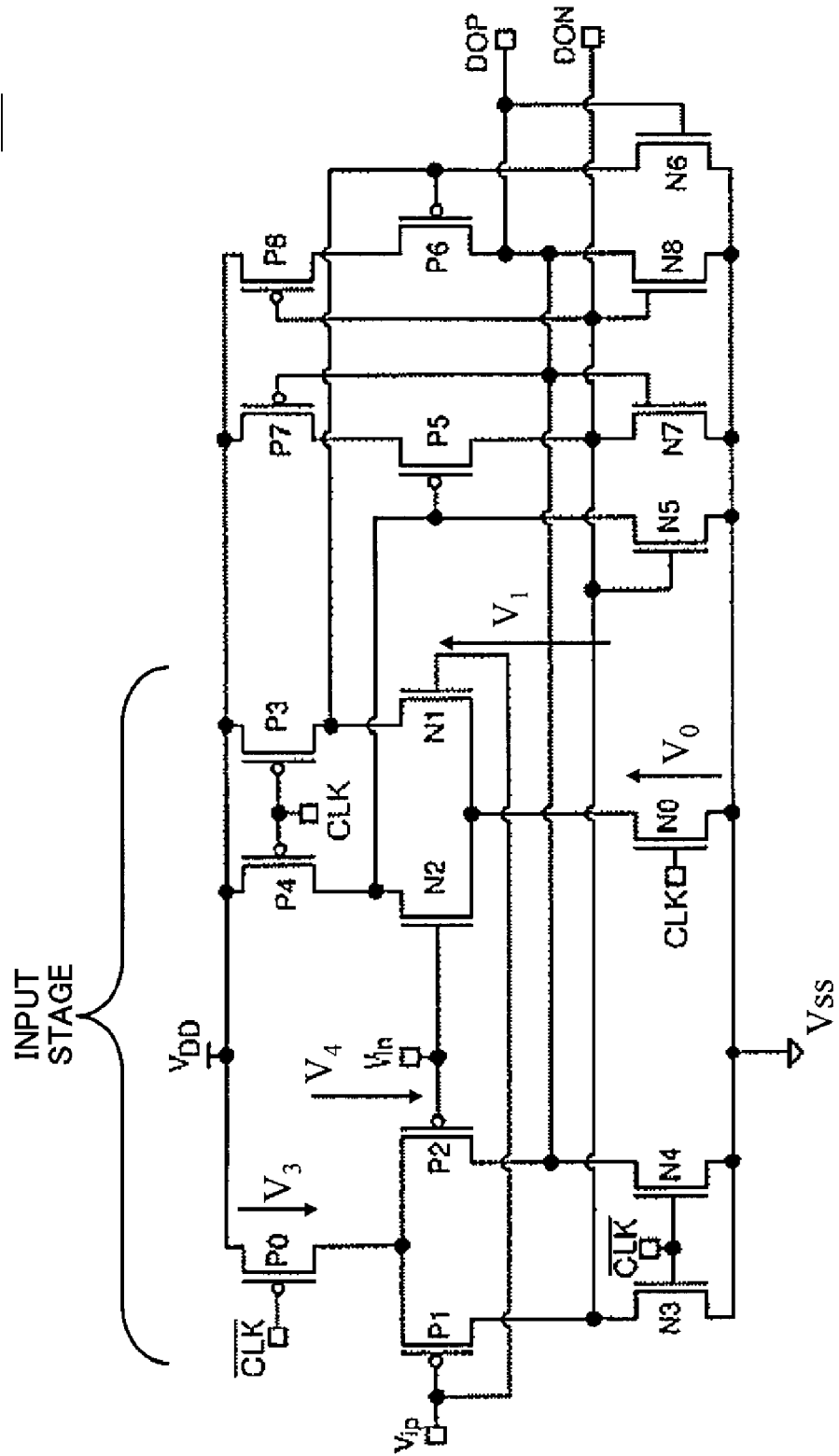
FIG. 5 shows an exemplary configuration of a comparator 112.

FIG. 5 shows an exemplary configuration of a comparator 112. The comparator 112 of the present embodiment is a clocked comparator that includes a rail-to-rail CMOS circuit at the input stage. The operation of such a clocked comparator is described in the document below.

Sekedi B. Kobenge and Huazhong Yang, "A 250 KS/s, 0.8V ultra low power successive approximation register ADC using a Dynamic rail-to-rail comparator," IEICE Electronics Express, Vol. 7, No. 4, p 261-267.

The CMOS circuit at the input stage includes a differential pair of transistors P1 and P2 and a differential pair of transistors N2 and N1. The input signal $V_{in}$ is input to the transistors P2 and N2, and the reference level $V_{ip}$ is input to the transistors P1 and N1. Furthermore, the comparator 112 operates according to a clock CLK and an inverted clock/CLK input to the transistors P0, P3, P4, N0, N3, and N4. In other words, the signal level of the input signal at the time when the clock is input is compared to the reference level. According to the comparison results, one of the outputs DOP and DON becomes high level and the other becomes low level.

When the comparator 112 is a clocked comparator, the clock is preferably distributed to the comparators 112 through equal-length wires, such as in an H tree. Furthermore, the input signal is also preferably distributed to the comparators 112 through equal-length wires, such as in an H tree. In this way, even when the signal level of the input signal changes quickly in series, the comparators 112 can output comparison results for the same input level.

Figure 6:
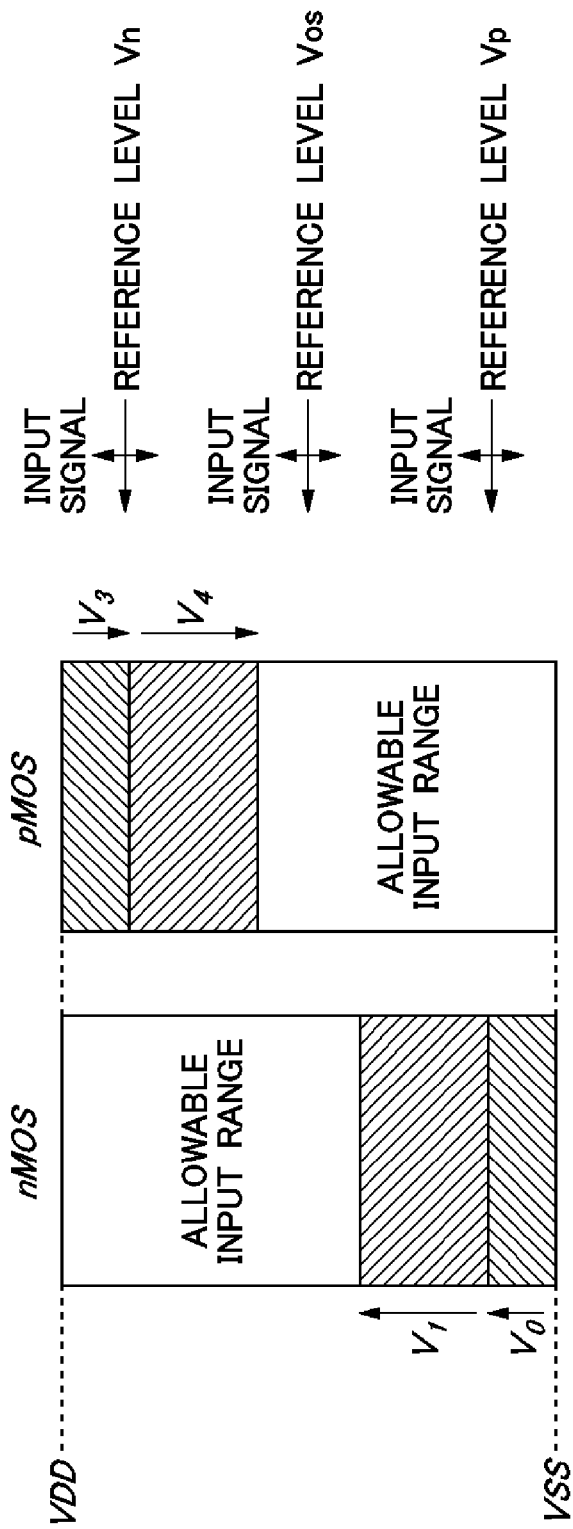
FIG. 6 is used to describe an operation of the rail-to-rail CMOS circuit.

FIG. 6 is used to describe an operation of the rail-to-rail CMOS circuit. The nMOSFETs (N1, N2) operate for input voltage within the allowable input range from a voltage near the power supply voltage $V_{DD}$ to a prescribed low voltage (Vss+$V_0$+$V_1$). The voltage $V_0$ corresponds to the voltage across the transistor N0 when turned ON. The voltage $V_1$ corresponds to the gate-source voltage of the transistor N1.

In the same manner, the pMOSFETs (P1, P2) operate for input voltage within the allowable input range from a voltage near the power supply voltage $V_{SS}$ to a prescribed high voltage ($V_{DD}$-$V_3$-$V_4$). By combining the pMOSFETs and nMOSFETs, the rail-to-rail CMOS circuit operates for a wide range of allowable input voltage. The allowable input range of the pMOSFETs and the allowable input range of the nMOSFETs in the rail-to-rail CMOS circuit include an overlapping range ($V_{SS}$+$V_0$+$V_1$ to $V_{DD}$-$V_3$-$V_4$).

The signal input section 210 sets the reference level $V_n$ within the allowable input range of the nMOSFETs, in a region that does not overlap with the allowable input range of the pMOSFETs (from near $V_{DD}$ to $V_{DD}$-$V_3$-$V_4$). Furthermore, as described in FIG. 4, the signal input section 210 sequentially changes the signal level of the input signal within this range (from near $V_{DD}$ to $V_{DD}$-$V_3$-$V_4$) from a level that is sufficiently lower than the reference level $V_n$ to a level that is sufficiently larger than $V_n$. This change may be discrete.

The detecting section 220 detects the number of comparators 112 that output a logic value of 1, for each level of the input signal resulting from a change relative to the reference level $V_n$. As described in FIG. 4, the detecting section 220 calculates the variation $\sigma_{thn}$ of the threshold voltages of the nMOSFETs, based on the distribution of the number of logic values of 1. In the configuration of the comparator 112 shown in FIG. 5, the number of logic values of 1 is counted in one of the outputs (DOP or DON).

Furthermore, the signal input section 210 sets the reference level $V_p$ within the allowable input range of the pMOSFETs, in a region that does not overlap with the allowable input range of the nMOSFETs. As described in FIG. 4, the signal input section 210 sequentially changes the signal level of the input signal within this range from a level that is sufficiently lower than the reference level $V_p$ to a level that is sufficiently larger than $V_p$.

The detecting section 220 detects the number of comparators 112 that output a logic value of 1, for each level of the input signal resulting from a change relative to the reference level $V_p$. As described in FIG. 4, the detecting section 220 calculates the variation $\sigma_{thp}$ of the threshold voltages of the pMOSFETs, based on the distribution of the number of logic values of 1. With the above process, the detection apparatus 200 can detect the variation $\sigma_{th}$ of the threshold voltages for each of the nMOSFETs and pMOSFETs.

Furthermore, the signal input section 210 sets the reference level $V_{os}$ in a range where the allowable input range of the nMOSFETs overlaps with the allowable input range of the pMOSFETs. As described in FIG. 4, the signal input section 210 sequentially changes the signal level of the input signal within this range from a level that is sufficiently lower than the reference level $V_{os}$ to a level that is sufficiently larger than $V_{os}$.

The detecting section 220 detects the number of comparators 112 that output a logic value of 1, for each level of the input signal resulting from a change relative to the reference level $V_{os}$. The detecting section 220 calculates the variation $\sigma_{os}$ of the input offsets of the comparators 112, based on the distribution of the number of logic values of 1. The input offset refers to the offset level that is superimposed on the different between the signal level of the input signal and the reference level when the signal level of the input signal is compared to the reference level.

In other words, even when an input signal with the same level as the reference level input to the comparators 112, comparators 112 that have an input offset will output a comparison result obtained from the input of an input signal including a difference relative to the reference level equal to the offset. This input offset also varies among the comparators 112. The detecting section 220 can detect the variation of the input offset.

The comparator 112 shown in FIG. 5 is a clocked comparator, but if the input signal is a DC signal, the comparator 112 may be a comparator that does not operate according to a clock. Furthermore, the comparator 112 may be an amplifier that amplifies the difference between the two input levels. For an amplifier as well, it is preferable to include a rail-to-rail CMOS circuit at the input stage, as shown in FIG. 5. The combining output section 114 or the detecting section 220 may convert the analog output of the amplifier into a logic value of 1 or 0 obtained from a comparison with a prescribed reference value.

Figure 7:
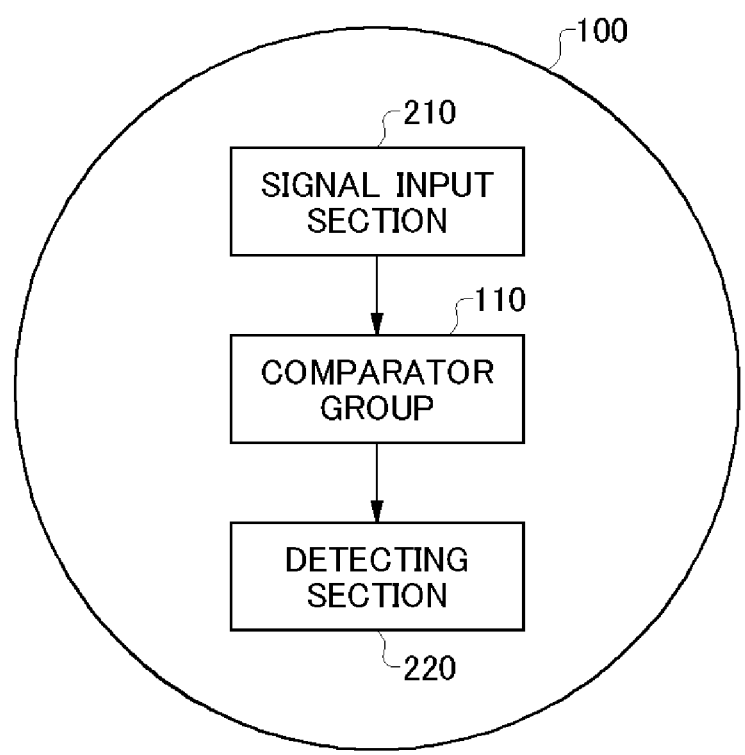
FIG. 7 shows another exemplary configuration of a semiconductor wafer 100 according to another embodiment of the present invention.

FIG. 7 shows another exemplary configuration of a semiconductor wafer 100 according to another embodiment of the present invention. The semiconductor wafer 100 of the present embodiment includes the comparator group 110, the signal input section 210, and the detecting section 220. In other words, the semiconductor wafer 100 includes the comparator group 110 and the detection apparatus 200 described in relation to FIGS. 1 to 6. With this configuration, the process variation of the comparators 112 can be detected within the semiconductor wafer 100.

Figure 8:
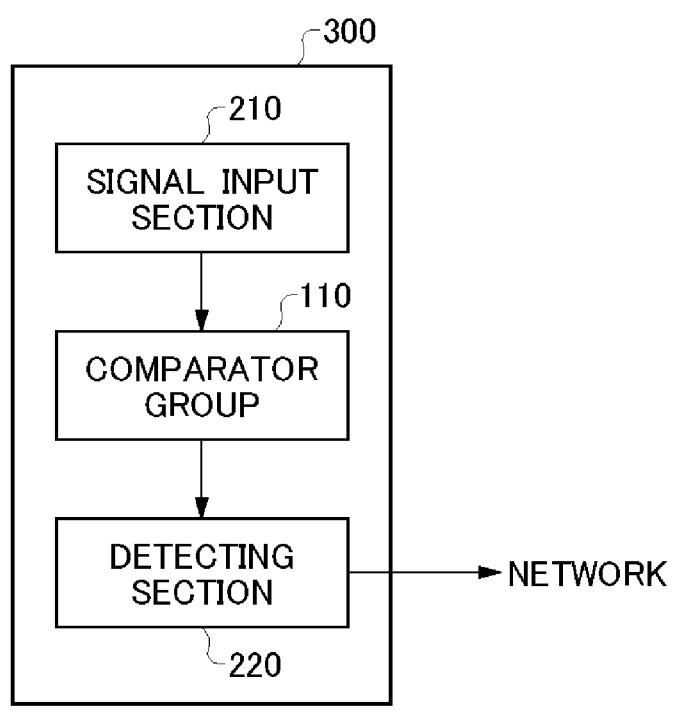
FIG. 8 shows an exemplary configuration of a electronic device 300 according to another embodiment of the present invention.

FIG. 8 shows an exemplary configuration of an electronic device 300 according to another embodiment of the present invention. The electronic device 300 of the present embodiment includes the comparator group 110, the signal input section 210, and the detecting section 220. In other words, the electronic device 300 includes the comparator group 110 and the detection apparatus 200 described in relation to FIGS. 1 to 6. With this configuration, the process variation of the comparators 112 can be detected within the electronic device 300.

The electronic device 300 may be a semiconductor chip. As another example, the electronic device 300 may be a communication device. The signal input section 210 and the detecting section 220 operate during each of a plurality of predetermined intervals, and detect the variation in characteristics of the comparators 112. The detecting section 220 may transmit the detected process variation to an external server, via a network. The server may measure the degradation over time of the variation in the characteristics of the comparators 112. The degradation over time of the variation refers to an increase in the deviation of the variation over time. As another example, the server may measure the average of the degradation over time, based on the information concerning the characteristic variation acquired from a plurality of electronic devices 300.

The detection apparatus 200 described in FIGS. 1 to 8 may apply a prescribed load continuously to each MOSFET. The detection apparatus 200 may measure the degradation over time of the characteristic variation of the comparators 112 for each prescribed interval. With this configuration, the NBTI (Negative Bias Temperature Instability) of pMOS-FETs, for example, can be measured.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A detection apparatus that detects fabrication process variation in a plurality of comparators that each output a comparison result obtained by comparing a signal level of an input signal to a reference level, the detection apparatus comprising:
a signal input circuit that inputs the input signal and the reference level in common to the comparators, and varies the signal level of the input signal; and
a detecting circuit that detects, for each signal level, a number of comparison results that indicate a predetermined logic value, from among the comparison results of the comparators, detects a statistical distribution of the number of comparison results that indicate the predetermined logic value, and detects the process variation based on the statistical distribution.

2. The detection apparatus according to claim 1, wherein the comparators each include a transistor, and
the detecting circuit detects the variation in threshold voltages of the transistors.

3. The detection apparatus according to claim 2, wherein the comparators each include a CMOS circuit at an input stage,
the signal input circuit varies the signal level of the input signal in each of a first range that is within an allowable input range for nMOS transistors of the CMOS circuit and that does not overlap with an allowable input range for pMOS transistors of the CMOS circuit and a second range that is within the allowable input range for the pMOS transistors and that does not overlap with the allowable input range for the nMOS transistors, and
the detecting circuit detects the variation in the threshold voltages of the nMOS transistors based on a statistical distribution of the number of comparison results that indicate the predetermined logic value when the signal level of the input signal is varied within the first range, and detects the variation in the threshold voltages of the pMOS transistors based on a statistical distribution of the number of comparison results that indicate the predetermined logic value when the signal level of the input signal is varied within the second range.

4. The detection apparatus according to claim 3, wherein the signal input circuit varies the signal level of the input signal within a third range where the allowable input range of the nMOS transistors and the allowable input range of the pMOS transistors overlap, and
the detecting circuit detects variation of input offsets of the comparators based on a statistical distribution of the number of comparison results that indicate the predetermined logic value when the signal level of the input signal is varied within the third range.

5. The detection apparatus according to claim 1, wherein the signal input circuit inputs a DC input signal to the comparators.

6. The detection apparatus according to claim 1, wherein the detection apparatus controls the number of comparators, from among the plurality of comparators, that undergo the process variation detection.

7. A wafer comprising:
a plurality of comparators that each output a comparison result obtained by comparing a signal level of a common input signal to a common reference level;
a signal input circuit that inputs the input signal and the reference level in common to the comparators, and varies the signal level of the input signal;
a combining output circuit that combines the comparison results output by the comparators in response to the input signal, and outputs the resulting combination; and
a detecting circuit that detects, for each signal level, a number of comparison results that indicate a predetermined logic value, from among the comparison results of the comparators, detects a statistical distribution of the number of comparison results that indicate the predetermined logic value, and detects fabrication process variation of the comparators based on the statistical distribution.

8. An electronic device comprising:
a plurality of comparators that each output a comparison result obtained by comparing a signal level of a common input signal to a common reference level;
a signal input circuit that inputs the input signal and the reference level in common to the comparators, and varies the signal level of the input signal;
a combining output circuit that combines the comparison results output by the comparators in response to the input signal, and outputs the resulting combination, and
a detecting circuit that detects, for each signal level, a number of comparison results that indicate a predetermined logic value, from among the comparison results of the comparators, detects a statistical distribution of the number of comparison results that indicate the predetermined logic value, and detects fabrication process variation of the comparators based on the statistical distribution.

9. The detection apparatus according to claim 1, wherein the plurality of comparators includes at least three comparators.

10. The detection apparatus according to claim 1, wherein the plurality of comparators includes at least four comparators.

11. The wafer according to claim 7, wherein the plurality of comparators includes at least three comparators.

12. The wafer according to claim 7, wherein the plurality of comparators includes at least four comparators.

13. The electronic device according to claim 8, wherein the plurality of comparators includes at least three comparators.

14. The electronic device according to claim 8, wherein the plurality of comparators includes at least four comparators.

* * * * *